(12) United States Patent
Lange

(10) Patent No.: US 7,808,088 B2
(45) Date of Patent: Oct. 5, 2010

(54) SEMICONDUCTOR DEVICE WITH IMPROVED HIGH CURRENT PERFORMANCE

(75) Inventor: Bernhard P Lange, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 11/757,514

(22) Filed: Jun. 4, 2007

(65) Prior Publication Data

US 2007/0284709 A1 Dec. 13, 2007

Related U.S. Application Data

(60) Provisional application No. 60/882,443, filed on Dec. 28, 2006.

(30) Foreign Application Priority Data

Jun. 7, 2006 (DE) .................. 10 2006 026 468

(51) Int. Cl.
*H01L 23/495* (2006.01)
*H01L 21/00* (2006.01)

(52) U.S. Cl. .............. 257/676; 257/E23.047; 257/E23.125; 257/666; 257/784; 257/786; 257/737; 257/738; 257/670; 257/669; 257/671; 257/672; 257/696; 257/698

(58) Field of Classification Search .......... 257/676, 257/E23.047, E23.125, 666, 784, 786, 737, 257/738, 670, 669, 671, 672, 696, 698; 438/123
See application file for complete search history.

(56) References Cited

U.S. PATENT DOCUMENTS

| 4,796,078 | A | | 1/1989 | Phelps, Jr. et al. | |
|---|---|---|---|---|---|
| 5,245,215 | A | * | 9/1993 | Sawaya | 257/676 |
| 5,339,518 | A | | 8/1994 | Tran et al. | |
| 5,592,019 | A | | 1/1997 | Ueda et al. | |
| 5,734,198 | A | | 3/1998 | Stave | |
| 5,770,479 | A | * | 6/1998 | Brooks et al. | 438/123 |
| 5,869,898 | A | * | 2/1999 | Sato | 257/728 |
| 5,977,615 | A | * | 11/1999 | Yamaguchi et al. | 257/666 |
| 5,982,029 | A | | 11/1999 | Graf | |
| 6,068,174 | A | * | 5/2000 | Ball et al. | 228/4.5 |
| 6,080,264 | A | * | 6/2000 | Ball | 156/292 |
| 6,130,474 | A | * | 10/2000 | Corisis | 257/676 |
| 6,462,404 | B1 | * | 10/2002 | Schoenfeld | 257/666 |
| 6,467,672 | B2 | * | 10/2002 | Ball et al. | 228/103 |
| 6,479,893 | B2 | * | 11/2002 | Embong et al. | 257/690 |
| 6,580,158 | B2 | * | 6/2003 | Corisis et al. | 257/666 |
| 6,762,079 | B2 | * | 7/2004 | Vaiyapuri | 438/123 |
| 6,864,566 | B2 | * | 3/2005 | Choi, III | 257/676 |
| 6,972,214 | B2 | | 12/2005 | Kuan et al. | |
| 7,002,249 | B2 | | 2/2006 | Duffy et al. | |
| 7,019,389 | B2 | * | 3/2006 | Lai et al. | 257/666 |
| 2002/0003294 | A1 | * | 1/2002 | Bissey | 257/676 |
| 2003/0160309 | A1 | * | 8/2003 | Punzalan et al. | 257/676 |
| 2005/0073057 | A1 | | 4/2005 | Tiziani et al. | |
| 2006/0154404 | A1 | * | 7/2006 | Corisis | 438/123 |
| 2007/0040187 | A1 | * | 2/2007 | Koike et al. | 257/177 |

(Continued)

*Primary Examiner*—Alexander O Williams
(74) *Attorney, Agent, or Firm*—Yingsheng Tung; Wade J. Brady, III; Frederick J. Telecky, Jr.

(57) ABSTRACT

A semiconductor device comprises a die having a first surface and a second surface, a first leadframe connected to the first surface and the second surface, and a second leadframe connected to the first surface.

6 Claims, 5 Drawing Sheets

U.S. PATENT DOCUMENTS

| | | | |
|---|---|---|---|
| 2007/0111393 A1* | 5/2007 | Burghout et al. | 438/123 |
| 2007/0114676 A1* | 5/2007 | Anderson et al. | 257/787 |
| 2007/0132112 A1* | 6/2007 | Ozaki et al. | 257/787 |
| 2008/0073778 A1* | 3/2008 | Edwards | 257/712 |
| 2009/0152691 A1* | 6/2009 | Nguyen et al. | 257/667 |
| 2009/0166826 A1* | 7/2009 | Janducayan et al. | 257/676 |

* cited by examiner

SEMICONDUCTOR DEVICE WITH IMPROVED HIGH CURRENT PERFORMANCE

The present invention generally relates to a semiconductor device. More particularly, the present invention relates to a package for high current performance.

BACKGROUND

Continuous miniaturization of electronic components demands that the integrated circuits in such components have to be made increasingly smaller in size, leadless semiconductor packages are widely used as integrated circuits in such electronic components.

Currently, semiconductor device packages such as QFN are formed by attaching a leadframe to a substrate and bonding the semiconductor chip (die) to the leadframe. However, increasing power and current requirements for smaller semiconductor device packages require multiple bond wire solutions and better dissipation of heat.

In a known art, a leadframe is provided with a central pad, upon which the die rests. The central pad acts as a heatsink to conduct heat away from the die during use. Surrounding the central pad are many connector pins, which are used for signal transmission to and from the die as well as for power supply and grounding. Pins are connected to a different part of the die for signal transmission to the integrated circuit and for supplying high current to the circuit. Pins designed for signal transmission are not optimized for high current paths, and can limit performance and lead to an inflexibility in chip design. The present invention has been devised with the foregoing in mind.

SUMMARY

Thus the present invention provides a semiconductor device, comprising a die and two leadframes. The first leadframe is optimized for signal transmission and the second leadframe is mainly designed for high current paths. The signal paths of the die can be wire bonded to the first leadframe and the high current path performance can be increased by using a second leadframe made of thicker metal than the first leadframe. The second leadframe can also carry signals in addition to high current. This two-leadframe invention is applicable to other semiconductor packages in addition to the leadless packages.

In a preferred embodiment, a die is disposed between the first leadframe and the second leadframe. The first leadframe has a die pad, which holds the die, and pins near the edges of the die. The second leadframe has pins that partially overlay the die pad and the die.

The die pad of the first leadframe acts as a heatsink to conduct heat away from the die; and the signal pins on the first leadframe are for electrical connection to the die. The second surface of the die is affixed to the die pad of the first leadframe and the first surface of the die connected to the signal pins.

Preferably the signal pins at the peripheral portion of the first leadframe is positioned such that it is offset from the second leadframe and therefore not coincident with the second leadframe. In this way, the first leadframe and the second leadframe do not contact each other and a more compact device may be achieved.

The central portion of the first leadframe should be bonded to the second surface of the die and the peripheral portion of the first leadframe bonded to the first surface of the die by a plurality of bond wires. Bonding of the second leadframe to the first surface of the die can take place either by a solder attachment or by bond wires.

Preferably the first surface of the die is an electrically active surface and the second surface of the die is a heat conducting surface.

The present invention also provides a method of manufacturing a semiconductor device. The method comprises providing a die having a first surface and a second surface, connecting a first leadframe to the first surface and the second surface, and connecting a second leadframe to the first surface.

BRIEF DESCRIPTION OF THE DRAWINGS

Further advantages and characteristics of the invention ensue from the description below of a preferred embodiments and from the accompanying drawings, in which.

DETAILED DESCRIPTION

Referring to FIGS. 1A to 1F, a prior art QFN leadless package design is shown. The package has a base leadframe 10, which comprises a die pad 11 and pin connectors 12 provided either side of the die pad 11 for providing signal connections between a die 13 and a substrate (not shown).

Figure 1A:
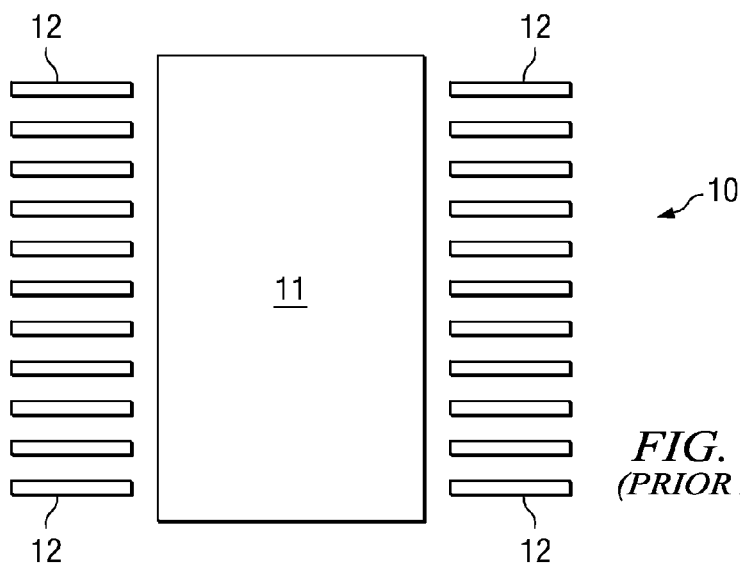
FIG. 1A is a top view of a prior art base leadframe.
Figure 1B:
FIG. 1B is a side view of a prior art base leadframe.
Figure 1C:
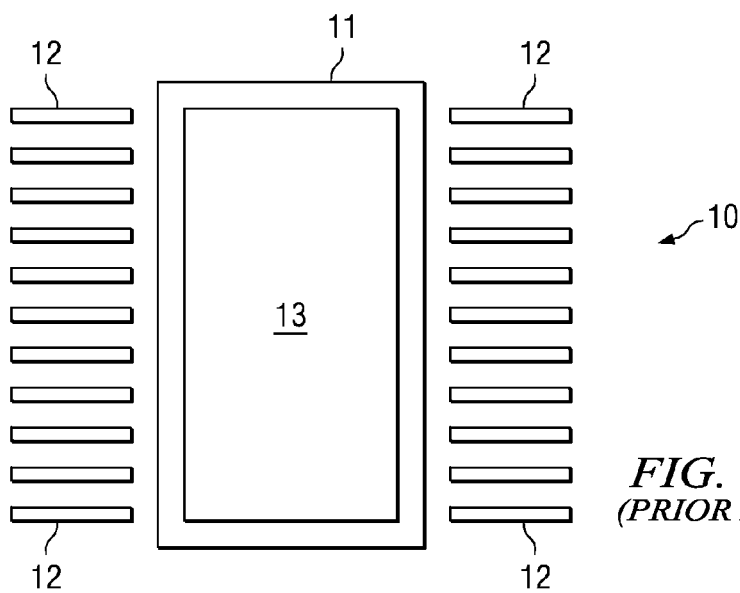
FIG. 1C is a top view of a die attached to a prior art base leadframe.
Figure 1D:
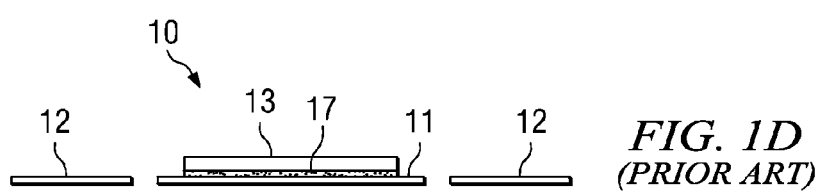
FIG. 1D is a side view of a die attached to a prior art base leadframe.
Figure 1E:
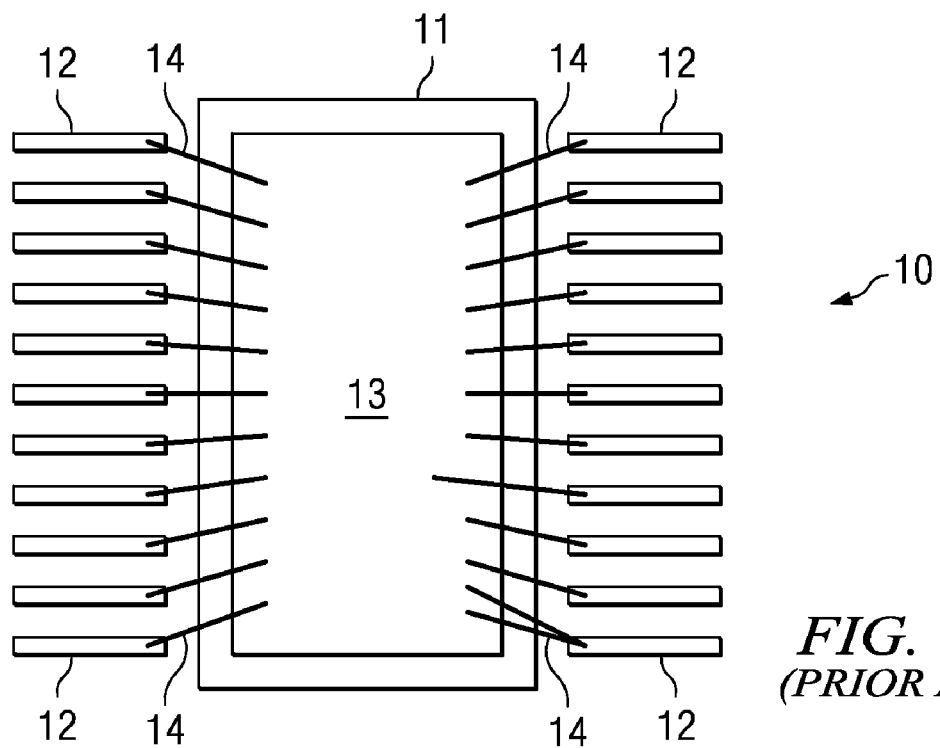
FIG. 1E is a top view of a die attached to a prior art base leadframe and bonded to signal wires.
Figure 1F:
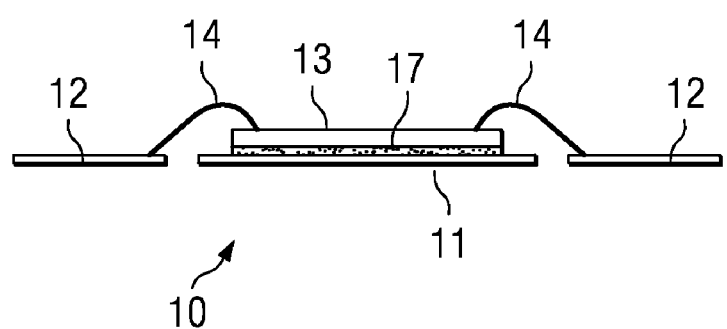
FIG. 1F is a side view of a die attached to a prior art base leadframe and bonded to signal wires.
Figure 2:
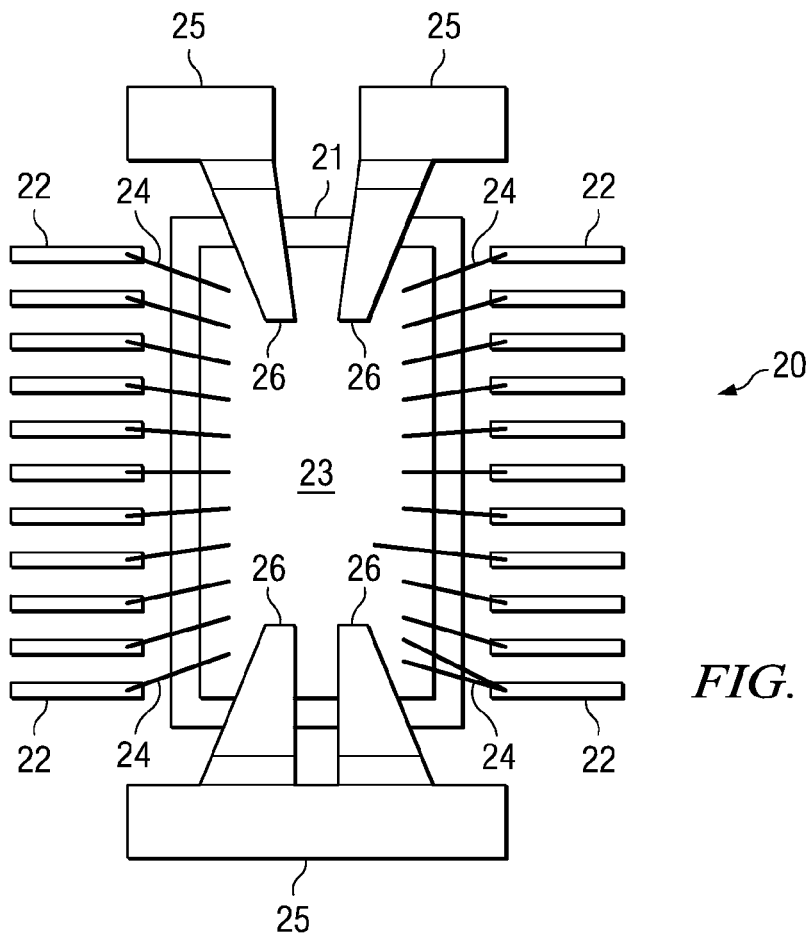
FIG. 2 is a top view of a device package according to the invention.
Figure 3:
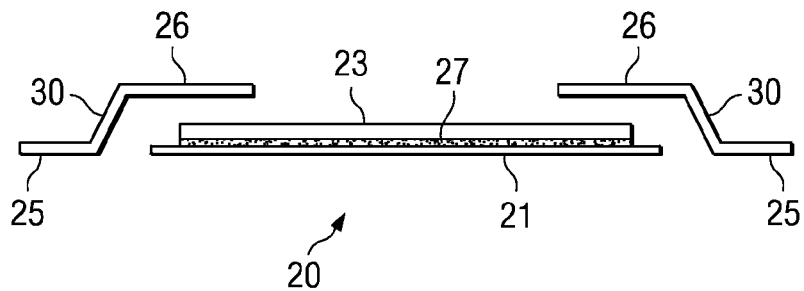
FIG. 3 is a side view in the x-direction of a device package according to the invention before interconnection of the die and the second leadframe.
Figure 4:
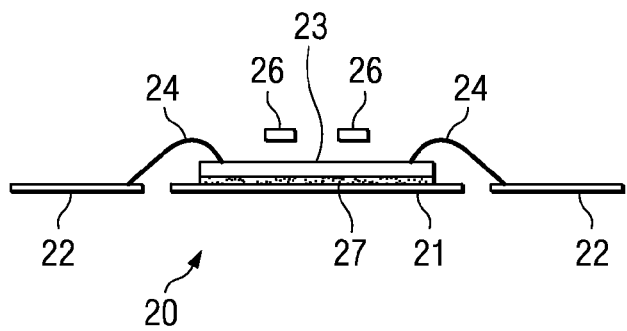
FIG. 4 is a side view in the y-direction of a device package according to the invention before interconnection of the die and the second leadframe.

FIGS. 1A and 1B show the base leadframe 10 before the die 13 is attached. In FIGS. 1C and 1D, the die 13 is provided on top of the leadframe 10 overlaying the die pad 11 and is bonded to die pad 11 by a solder bond 17, or other thermally conductive material, for example epoxy resin. In FIGS. 1E and 1F, bond wires 14 are bonded to the pin connectors 12 and the die 13 and are used to connect the pin connectors 12 to the die 13 to allow conduction of signals between the die 13 and the pin connectors 12. The bond wires 14 are operable to carry a low current signal.

The present invention will now be described with reference to FIGS. 2 to 10. The bonding process for attaching the die to the first leadframe is the same as that used in the prior art and will not be described here.

A leadframe 20 has connector pins 22 provided at the periphery of the leadframe 20 and a central die pad portion 21 provided in the center of the leadframe 20. The connector pins 22 are shown here provided on either side of the die pad 23. However connector pins 22 may also be provided only on one side of the die pad or on three sides. The semiconductor die 23 rests on top of the central die pad portion 21 and is connected to the connector pins 22 by the bonding wires 24. The die 23 rests on top of the die pad 21 such that its bottom surface is facing the die pad 21 and its top surface is connected to the pins 22. Each pin 22 is connected to the top surface of the die 23 by a bonding wire 24.

A second leadframe 25 is positioned adjacent to the sides of the die 23 where there are no connector pins 22 positioned from the first leadframe 20. The second leadframe 25 comprises pins 26, which overlay a part of the top surface of the die 23. It can be seen from FIGS. 3 and 4, which show side views of both the X and Y directions of the device, that the second leadframe 25 forms a recess into which two opposing sides of the die 23 and the die pad 21 are received. Because the pins 26 of the second leadframe 25 overlay the die 23 in the direction perpendicular to the direction of the pin portions 22 of the first leadframe 20, this makes the device more compact.

The second leadframe 25 may be etched or bent or both to form recesses 30.

The pin portions 22 of the base leadframe 20 are bonded to the top surface of the die 23 by bonding wires 24. The lower surface of the die 23 is bonded to the die pad 21 by a solder connection 27 or any other thermally conductive material, such as epoxy resin. The pins 26, of the second leadframe 25 are also bonded to the top surface of the die 23. This can take place either by a metal solder connection 27 or a bond wire 28, or both.

Figure 5:
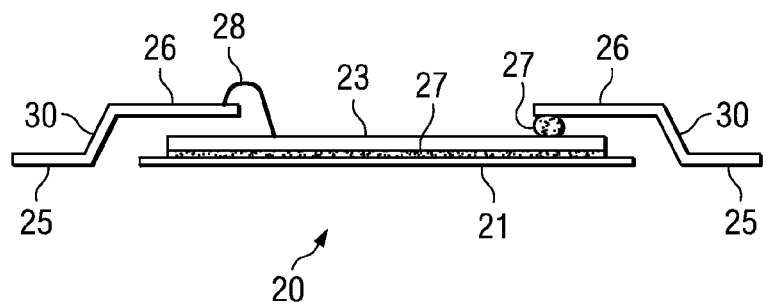
FIG. 5 is a side view in the x-direction of a device package according to the invention after bonding of the die to the second leadframe.
Figure 6:
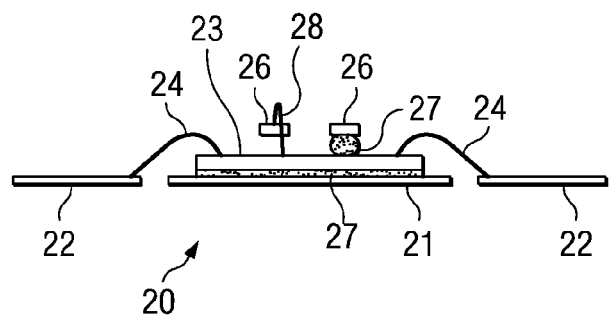
FIG. 6 is a side view in the y-direction of a device package according to the invention after bonding of the die to the second leadframe.

FIGS. 5 and 6 depict two embodiments of electrically connecting the die 23 to the pins 26 of the top leadframe. One may use a bonding wire 28 to connect a pin 26 to the die 23. The bonding wire 28 maybe thicker than bonding wire 24. One may also use a metallic body such as a solder body or a metal stud 27 to connect the pin 26 to the die 23.

Figure 7:
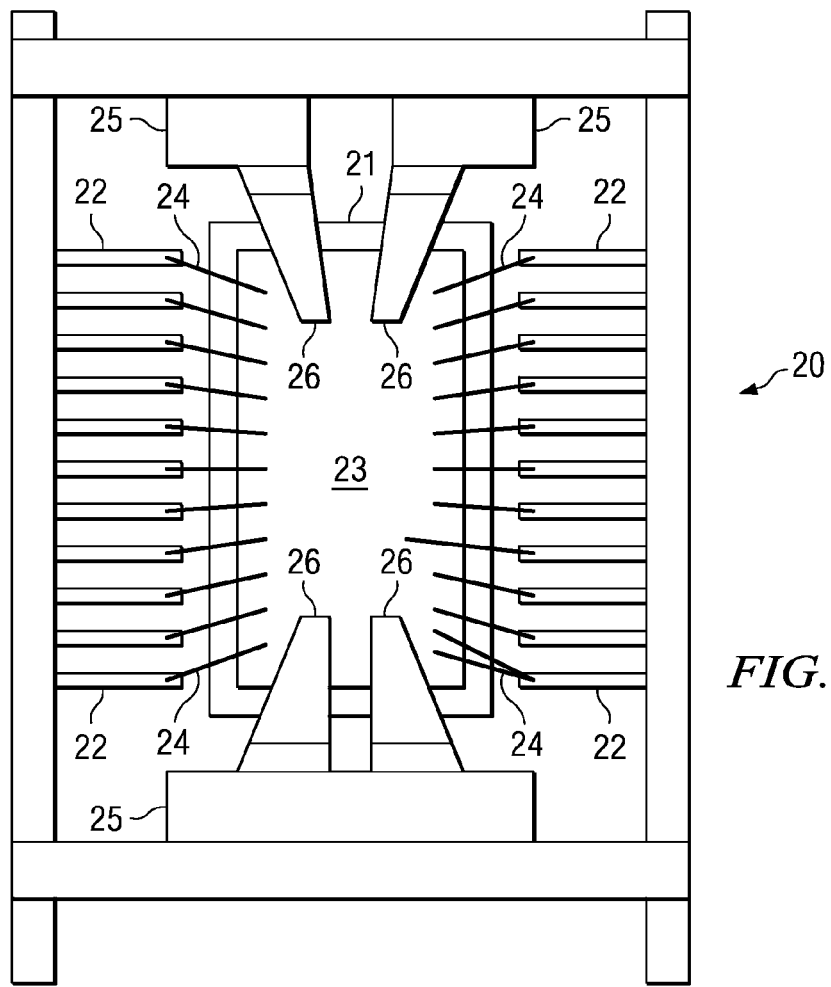
FIG. 7 is a top view of a single device package according to the invention before singulation.
Figure 8:
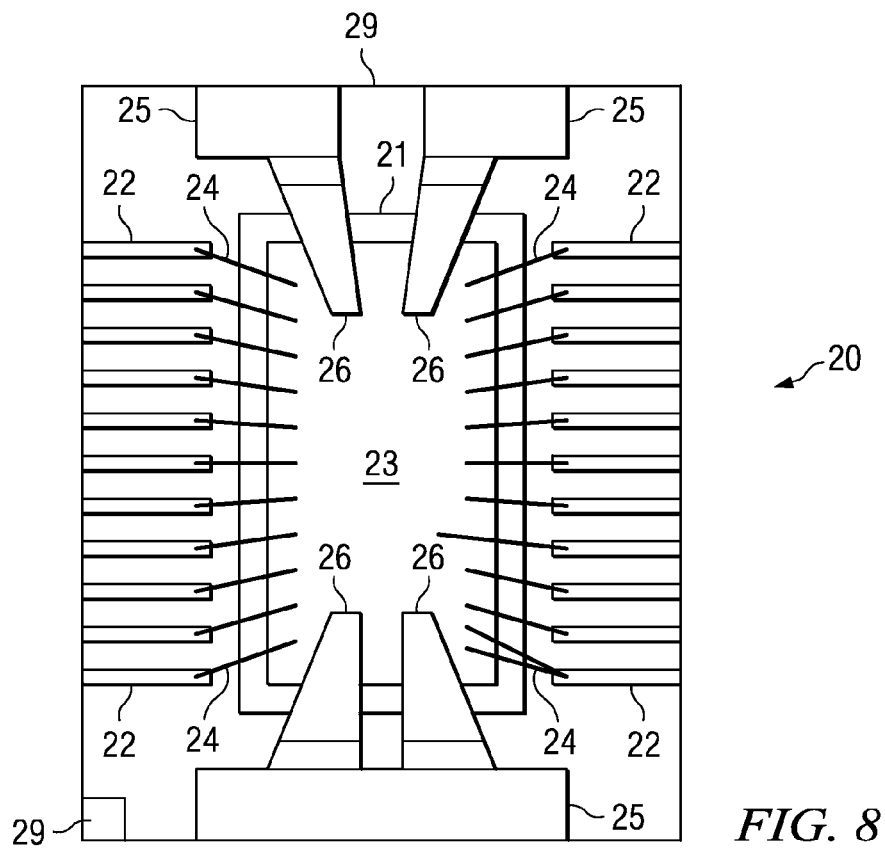
FIG. 8 is a top view of a singulated encapsulated device package according to the invention, with the encapsulant shown only around the sides of the device.
Figure 9:
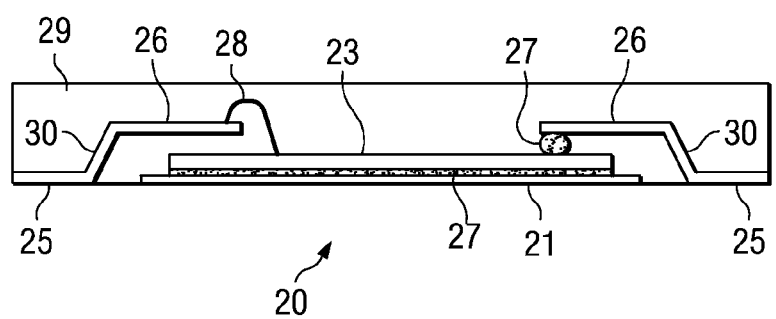
FIG. 9 is a side view in the x-direction of a singulated encapsulated device package according to the invention.
Figure 10:
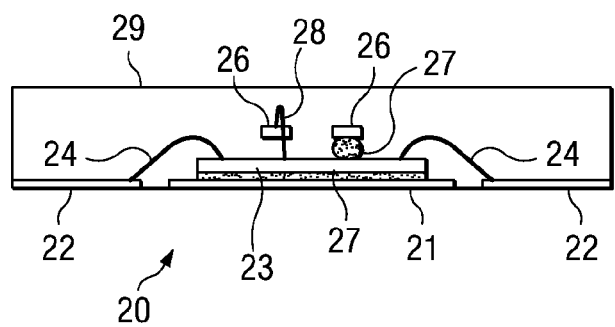
FIG. 10 is a side view in the y-direction of a singulated encapsulated device package according to the invention.

When interconnection of the die 23 with the first leadframe 20 and the second leadframe 25 has taken place, each device package is encapsulated and then singulated. FIG. 7 shows the device package before it is encapsulated; and FIGS. 8 to 10 show the device after it is encapsulated and singulated.

The device may be encapsulated in a mold compound 29 to provide the device with mechanical strength and then singulated. In FIG. 8 the encapsulant on the top of the device is not shown for clarity. In this embodiment, the final device package the bottom leadframe 20 provides low current carrying signal pins 22, while the top leadframe 25 provides pins 26 for high current and thermal power dissipation. Pins 26 is preferably made of thicker metal than the bottom leadframe 20, so as to allow for increased thermal power dissipation and current carrying capability. The die pad 21 acts as a heat sink for conducting heat away from the die 23. Thus the provision of two leadframes—a bottom leadframe and an upper leadframe—in the device allows for both high current and low current signals to be transmitted to and from the device simultaneously. This configuration allows high current signals to be conducted in a leadframe 25, which allows for the large thermal power dissipation associated with such signals. The top leadframe 25 has been shown in this embodiment overlaying the die 23 on just two opposing sides; however, the upper leadframe 25 can be provided on any side of the die and on all sides of the die.

Although the present invention has been described herein above with reference to a specific embodiment, it is not limited to this embodiment and no doubt further alternatives will occur to the skilled person that lie within the scope of the invention as claimed.

What is claimed is:

1. A semiconductor device, comprising:
   a semiconductor die having a first surface and a second surface, the semiconductor die disposed between a first set of pins of a first leadframe and a die pad of a second leadframe;
   the first set of pins having a first width and a first thickness, extending across one edge or two first opposite edges of the semiconductor die;
   a second set of pins of the second leadframe having a second width and a second thickness extending near edges of the semiconductor die not crossed by the first set of pins;
   the die pad having a thickness same as the second thickness; and
   the first width different from the second width.

2. The semiconductor device of claim 1, in which the first set of pins are attached to the semiconductor die via bond wires.

3. The semiconductor device of claim 1, in which the first set of pins attach to the semiconductor die via solder attachments.

4. The semiconductor device of claim 1, in which the first set of pins and the second set of pins have different thicknesses.

5. The semiconductor device of claim 1, in which the second set of pins are attached to the semiconductor die via bond wires.

6. A method of manufacturing a semiconductor device, comprising:
   attaching a first surface of a semiconductor die to a die pad of a first thickness;
   placing a first set of pins of a first width across at least one edge of the semiconductor die and overhanging the second surface of the semiconductor die;
   attaching the first set of pins to the second surface of the semiconductor die; and
   connecting a second set of pins having a second width different from the first width extending near the edges of the semiconductor die not crossed by the first set of pins.

* * * * *